United States Patent [19]

Michalik

[11] Patent Number: 4,549,149

[45] Date of Patent: Oct. 22, 1985

[54] CURRENT TO FREQUENCY CONVERTER SWITCHED TO INCREASED FREQUENCY WHEN CURRENT INPUT LOW

[75] Inventor: John K. Michalik, Sloan, N.Y.

[73] Assignee: Warner-Lambert Technologies, Inc., Southbridge, Mass.

[21] Appl. No.: 483,408

[22] Filed: Apr. 8, 1983

[51] Int. Cl.[4] .................. G01J 5/22; H03K 3/02
[52] U.S. Cl. ........................ 331/66; 331/111; 331/143; 331/153; 331/177 R; 354/410; 354/458
[58] Field of Search .......... 331/66, 111, 143, 153, 331/177 R, 179; 354/410, 458

[56] References Cited

U.S. PATENT DOCUMENTS

| | | | |
|---|---|---|---|
| 3,693,112 | 9/1972 | Briggs | 331/177 R X |
| 3,878,484 | 4/1975 | Hekimian | 331/143 |
| 3,902,139 | 8/1975 | Harrell | 331/143 X |
| 4,057,809 | 11/1977 | Nakamoto et al. | 354/458 |
| 4,206,648 | 6/1980 | Tuska et al. | 331/66 X |
| 4,311,375 | 1/1982 | Matsuura | 354/410 X |
| 4,408,169 | 10/1983 | Fraser | 331/143 X |

Primary Examiner—Eugene R. LaRoche
Assistant Examiner—D. C. Mis
Attorney, Agent, or Firm—Alan H. Spencer; Stephen Raines

[57] ABSTRACT

A current to frequency converter comprising a current source, for example a photocell, a voltage to frequency converter, an integrator in the feedback loop of the converter, the current source being connected to the summing junction of the converter and integrator such that the frequency of output pulses from the converter is directly proportional to the magnitude of current injected from the converter to the summing junction, and a controlled circuit for attenuating the current injected from the converter to the summing junction to increase the frequency of output pulses. The controlled attenuating circuit includes a transistor switching arrangement for introducing increased resistance in the path for current injected from the converter to the summing junction in response to the presence of a control signal.

6 Claims, 2 Drawing Figures

4,549,149

CURRENT TO FREQUENCY CONVERTER SWITCHED TO INCREASED FREQUENCY WHEN CURRENT INPUT LOW

BACKGROUND OF THE INVENTION

This invention relates to the art of controlled oscillators, and more particularly to a new and improved current to frequency converter having an increased dynamic range.

One area of use of the present invention is in converting light to electrical pulses having a frequency proportional to the light intensity, although the principals of the present invention can be variously applied. A light to frequency converter is an application of a current to frequency converter wherein light on a photocell generates a proportional current which is converted to pulses having a frequency proportional to the light intensity. With low current levels, i.e. low light levels, the frequency output can become too low for a short measurement time. Also, if the low current level causes the output frequency to be less than line frequency, the current source, i.e. photocell, can experience a modulation causing an inaccurate correspondence between output frequency and light or current magnitude.

SUMMARY OF THE INVENTION

It is, therefore, a primary object of this invention to provide a new and improved current to frequency converter.

It is a more particular object of this invention to provide such a converter having an increased dynamic range.

It is a further object of this invention to provide a light to frequency converter which operates effectively with a short measurement time at both low and high light levels.

It is a further object of this invention to provide such a converter which is effective in operation and simple in construction.

The present invention provides a current to frequency converter comprising a current source, for example a photocell, a voltage to frequency converter, an integrator in the feedback loop of the converter, the current source being connected to the summing junction of the converter and integrator such that the frequency of output pulses from the converter is directly proportioned to the magnitude of current from the source and inversely proportional to the magnitude of current injected from the converter to the summing junction, and controlled means for attenuating the current injected from the converter to the summing junction to increase the frequency of output pulses. The controlled attenuating means comprises means for increasing the resistance in the path for current injected from the converter to the summing junction in response to the presence of a control signal.

The foregoing and additional advantages and characterizing features of the present invention will become clearly apparent upon a reading of the ensuing detailed description together with the included drawing wherein:

BRIEF DESCRIPTION OF THE DRAWING FIGURES

FIG. 1 is a schematic circuit diagram of a current to frequency converter according to the present invention; and FIG. 2 is a graph including waveforms illustrating high and low current operating modes of the converter of FIG. 1.

DETAILED DESCRIPTION OF THE ILLUSTRATED EMBODIMENT

In a basic current to frequency converter, there is provided a voltage to frequency converter with an integrator in the feedback loop and a current source connected to the summing junction Current from the source is accumulated by the integrator which applies to the converter applying the first or upward portion of a ramp function waveform, and when the waveform exceeds a threshold magnitude and a predetermined time thereafter the converter injects current into the summing junction thereby providing the second or downward portion of the ramp function waveform. Cyclic operation of the foregoing provides an output frequency signal from the converter proportional to the current magnitude. In accordance with the present invention, when the current magnitude is low and an increased frequency output is desired to accommodate a short measuring time, the current injected into the summing junction is attenuated by controlled means included in the current injection path between the converter and the summing junction. The controlled attenuating means comprises resistance means and switching means responsive to a control signal for placing said resistance means in the current injection path.

Figure 1:
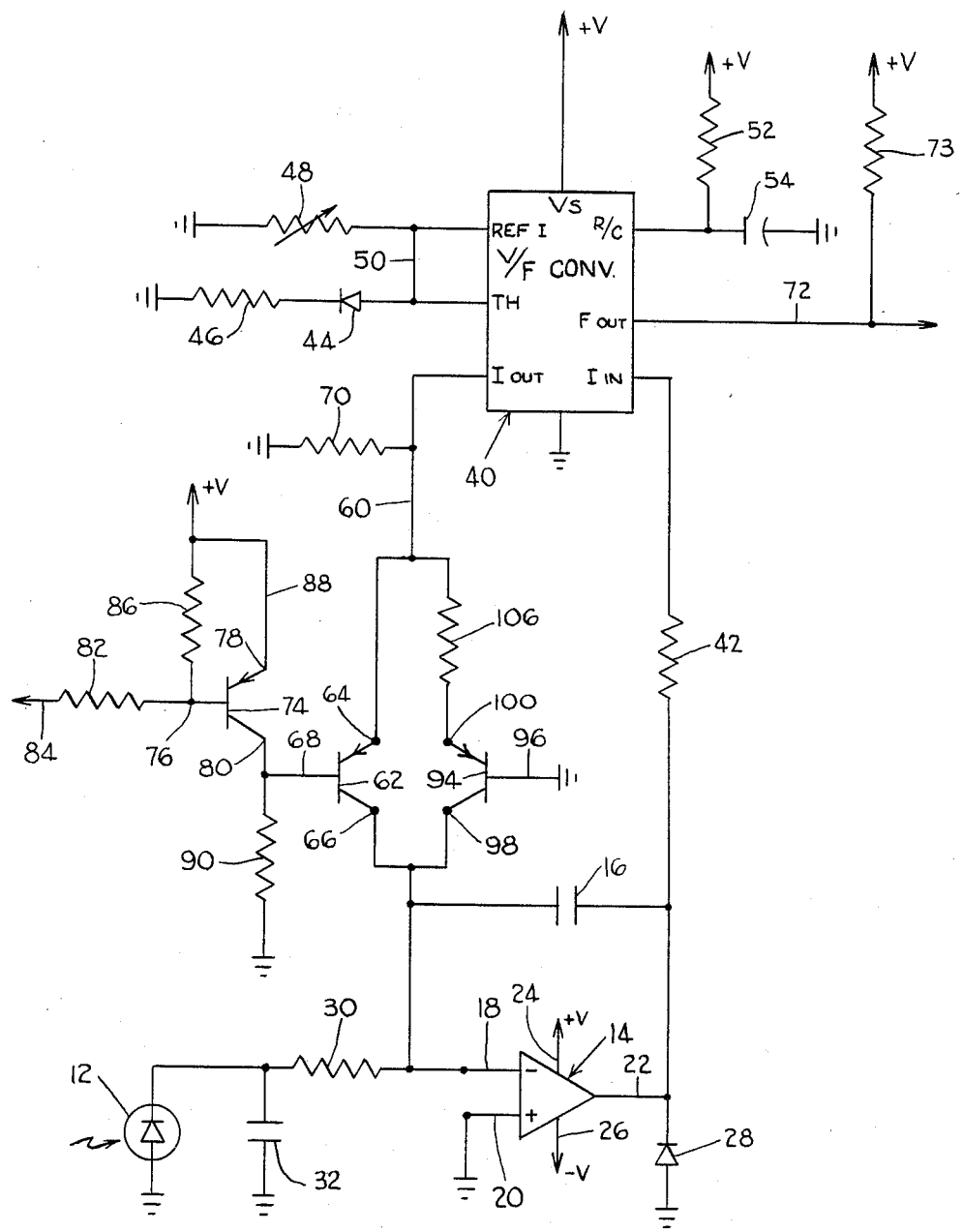

A current to frequency to converter according to the present invention is shown in FIG. 1, and it includes a current source generally designated 12. In the arrangement shown, current source 12 is a silicon-type photocell whereby the circuit converts light levels to a proportional frequency. The circuit of FIG. 1 further comprises an integrator including an operational amplifier 14 and capacitor 16. In particular, amplifier 14 has negative and positive input terminals 18 and 20 respectively, and an output terminal 22. Capacitor 16 is connected between output terminal 22 and the negative input terminal 18 of amplifier 14. The junction of capacitor 16 and amplifier input terminal 18 is the summing junction for the converter circuit of FIG. 1 in a manner which will be further described. Amplifier 14 also is connected by lines 24 and 26 to appropriate bias voltages designated plus V and minus V, respectively. A diode 28 is connected between amplifier output terminal 22 and ground. The negative input terminal 18 of amplifier 14 is connected to photocell 12 through a resistor 30. A capacitor 32 is connected between ground and the junction of photocell 12 and resistor 30. In the circuit of FIG. 1, the photocell 12 is poled relative to amplifier 14 and capacitor 16 to operate as a negative current source with respect to the circuit. By appropriate changes in the relative polarity connections among photocell 12, amplifier 14 and capacitor 16, the photocell 12 could be connected relative to the circuit as a positive current source.

The converter according to the present invention further comprises a voltage to frequency converter generally designated 40. By way of example, in an illustrative circuit, converter 40 can be a National Semiconductor LM331 voltage to frequency converter. The output of the integrator, which is the junction of amplifier output terminal 22 and capacitor 16, is connected through a resistor 42 to the current in terminal of converter 40, designated $I_{IN}$ in FIG. 1 which also is pin 7 on the LM331 converter. The series combination of a diode 44 and resistor 46 is connected between the threshold terminal, TH, of converter 40 which also is pin 6 on the LM331. The anode of diode 44 is connected to terminal TH. A reference current terminal designated REF I, which also is pin 2 on the LM331 converter, is connected through a variable resistor 48 to ground, and the threshold and reference current terminals also are connected together by line 50. When the voltage applied to the $I_{IN}$ terminal exceeds the threshold voltage measured at the threshold terminal TH, an internal timer is started in the converter 40. An internal current source having a value set by adjustable resistor 48 also is turned on. In order to determine the timer duration, a resistor 52 is connected between an R/C terminal of converter 40 and a plus V supply voltage and a capacitor 54 is connected between terminal R/C and ground. Terminal R/C also is pin 5 on the LM331 converter. The timer duration is set according to the relationship timer duration=1.1 RC where R is the magnitude of resistor 52 and C the magnitude of capacitor 54.

The convertor 40 also includes a terminal from which charge is injected to the circuit summing junction which terminal is identified $I_{OUT}$ which also is terminal 1 of the LM331 converter. Current is injected by convertor 40 to the circuit summing point through a path including line 60 and the emitter-collector path of a transistor 62 which normally is turned on. In particular, transistor 62 is of the PNP type having an emitter terminal 64 connected to line 60, a collector terminal 66 connected to the summing junction of capacitor 16 and amplifier input terminal 18, and a base terminal 68. A resistor 70 is connected between line 60 and ground. The converter 40 also includes an output frequency terminal designated $F_{OUT}$ which also is terminal 3 in the LM331 converter. This terminal is connected by a line 72 to a circuit which utilizes the output pulses in a manner which will be described. A resistor 73 is connected between line 72 and the positive bias voltage plus V.

In accordance with the present invention there is provided means for attenuating the current injected into the summing junction and in a controlled manner. There is provided switching means in the form of PNP transistor 74 having base, emitter, and collector terminals 76, 78 and 80, respectively. A control signal is applied to the base of transistor 74 by means of a resistor 82 connected by a line 84 to a source of control signals. The nature of the signal on line 84 controls the operation of the attenuating means in a manner which will be described. Base 76 also is connected through a resistor 86 to the source of positive bias voltage plus V, and emitter 78 also is connected by line 88 to that source. Collector 80 is connected to the base terminal 68 of transistor 62 and also is connected through a resistor 90 to ground. There is provided another PNP transistor 94 having base, collector and emitter terminals 96, 98, 100, respectively. The base terminal 96 connected to ground, collector terminal 98 is connected to the summing junction of capacitor 16 and amplifier input 18, and the emitter terminal 100 is connected through a resistor 106 to line 60.

Figure 2:
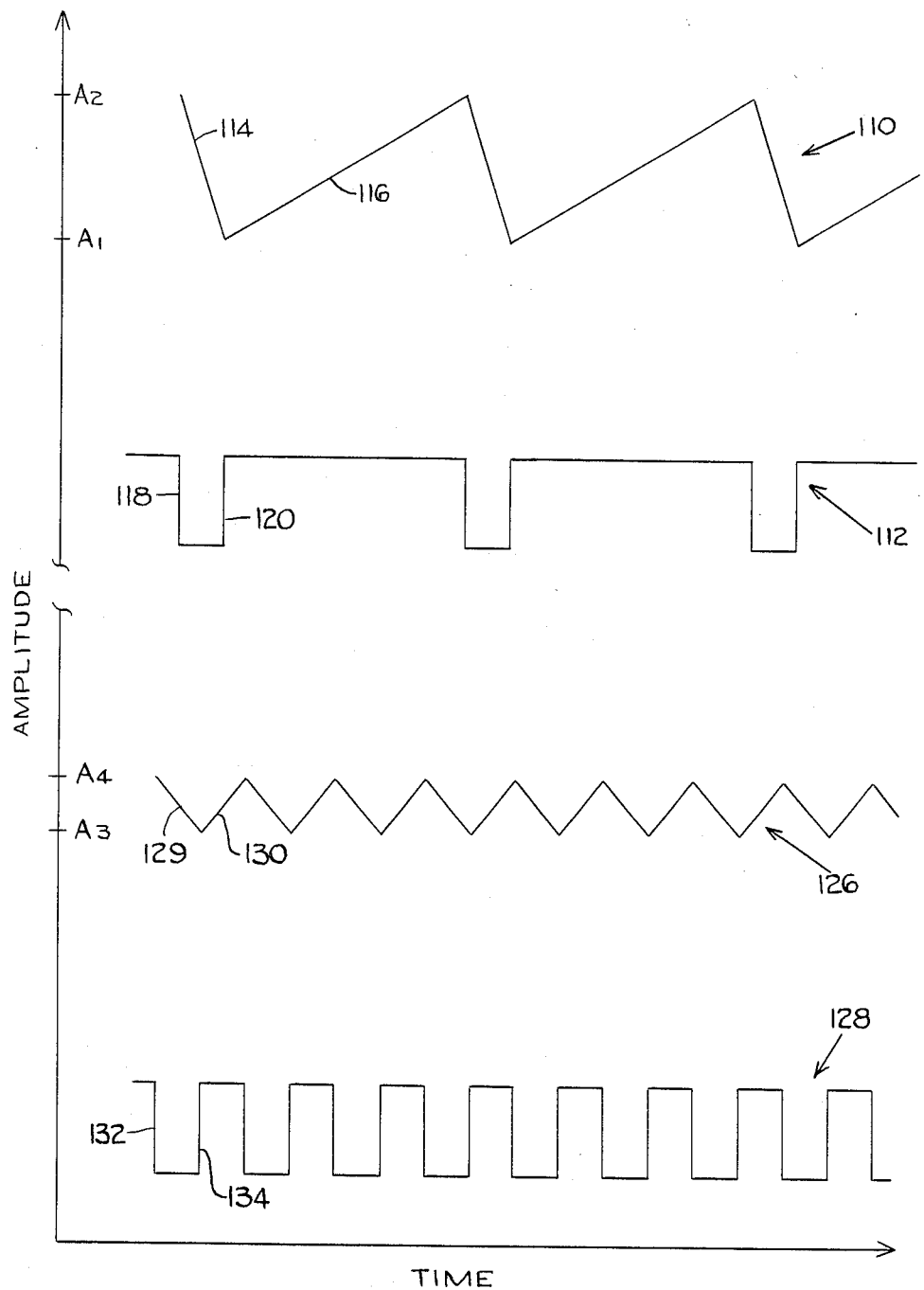

The circuit of FIG. 1 operates in the following manner. Assume that the signal on line 84 is positive and of sufficient magnitude, for example five volts, to turn transistor 74 off. With transistor 74 off, the voltage on base terminal 68 is zero thereby turning transistor 62 on. With transistor 62 on the majority of the current flowing from the IOUT terminal of converter 40 flows through line 60 and the emitter-collecter path of transistor 62 to the summing junction, i.e. the junction of capacitor 16 and amplifier input terminal 18. This ramps down the waveform applied to converter terminal $I_{IN}$ while the timer in converter 40 is on. After the time out, the current source in converter 40 is disconnected and the positive going ramp from current source 12, i.e. the photocell, will begin again. This cyclic action will generate an output frequency on line 72 according to the equation:

$$I_{SIGNAL} = I_{OUT}(1.1RC) F_{OUT}$$

Where $I_{SIGNAL}$ is the ramp waveform current applied to converter terminal $I_{IN}$, R is the magnitude of resistor 52 and C is the magnitude of capacitor 54. This is illustrated further in FIG. 2 where waveform 110 represents the ramp waveform applied to converter terminal $I_{IN}$ and waveform 112 represents the pulse output waveform on line 72. As shown in FIG. 2, the ramp waveform 110 has minimum and maximum amplitudes $A_1$ and $A_2$, respectively, and has downward and upward portion 114 and 116, respectively, which meet at a point. Each pulse in waveform 112 has leading and trailing edges 118 and 120, respectively, corresponding to the beginnings of the downward and upward ramp portion 114 and 116, respectively. The time between pulses of waveform 112 is determined by the time between the peaks of the ramp waveform 110.

Thus, in the circuit of FIG. 1, the output of the integrator is a ramp function wherein the ramp time is exactly proportional to the magnitude of the input current to the integrator. This input current is obtained from current source 12, and when the current from source 12 is relatively low the frequency of pulses on line 72 also will be relatively low with the result that the time between pulses on line 72 will be relatively large. When it is desired to measure the period of pulses on line 72 with a relatively short measuring, interval, there may be too few pulses or even an absence of pulses during the measuring interval thereby precluding an accurate or effective measurement. For example, in using photocell 12 to measure light intensity, with the frequency of pulses on line 72 being proportional to the intensity of light on photocell 12, at low light levels the period of pulses on line 72 may be too great for use with short measurement intervals.

When it is determined that the frequency of pulses on line 72 is too low, the control signal on line 84 is switched to a zero or low level sufficient to turn transistor 74 on with the result that transistor 62 is turned off. Then the main path for current from the $I_{OUT}$ terminal of converter 40 is along line 60 and only through the emitter-collecter terminal of transistor 94 to the summing junction. The magnitude of the current is determined by the ratio $R_A/(R_A+R_B)$ where $R_A$ is resister 70 and $R_B$ is resistor 106. The current injected from converter terminal $I_{OUT}$ therefore is divided by the same ratio. As a result, the frequency of pulses on line 72 will increase by the same ratio amount to balance the signal current and the charge generated by the photocell current.

The foregoing is illustrated by the waveforms 126 and 128 in FIG. 2. In particular, the ramp waveform 126 applied to converter terminal $I_{IN}$ has a relatively smaller range between minimum and maximum amplitudes $A_3$ and $A_4$, respectively. The attenuation of the current injected to the summing junction reduces the extent of the downward portion 129 of the ramp waveform thereby decreasing the distance between the peaks of the ramp waveform as shown. This in turn results in an increase in the frequency of output pulses as represented by the waveform 128.

In the circuit of FIG. 1, resistor 30 and capacitor 32 provide a low pass filter to filter out the modulation of current when the light incident on photocell 12 is provided by an a.c. operated light source. Diode 44 and resistor 46 provide some temperature compensation of the circuit. With increasing temperature, the frequency may increase. Then the forward voltage drop on diode 44 will decrease and cause more current to be generated by the current source, compensating the change.

In the current to frequency converter of the present invention, current source 12 can be of other forms besides the illustrative photocell. Examples are an ion detector and a temperature or humidity sensitive resistor connected to a voltage source.

One area of use of the converter of the present invention is in a camera exposure control wherein photocell 12 converts light used to expose the film into a proportional frequency for measurement. Such exposure control finds use in apparatus for making photomicrographs where a wide range of light intensities can be encountered, expecially since both transmitted and reflected light situations occur. Thus, transmitted light from a source can have an intensity of approximately 2000 foot candles, whereas light reflected from a specimen on a microscope slide can be at very low levels, for example about 0.01 foot candles. In such apparatus, line 72 in the circuit of FIG. 1 is connected to a circuit for measuring the period of output pulses, and such circuitry can have a relatively short measuring time, for example ⅓ second. Thus, at extremely low light levels resulting in low current from photocell 12, the period of pulses on line 72 may even be greater than the duration of the measuring interval. Accordingly, a control signal is applied to line 84 initiating attenuation of the injected current as previously described thereby increasing the frequency of output pulses at such low light levels to provide compatibility with the measuring interval. In addition, photocell 12 can be of the silicon type which has a broad spectral response. The converter of the present invention, with the two modes which increase the dynamic range thereof, enables an exposure control of the foregoing type to employ the advantage of a silicon photocell with broad spectral response.

By way of example, in an illustrative circuit, photocell 12 is of the silicon type, capacitor 16 has a magnitude of about 2200 picofarads, resistor 30 has a magnitude of about 2.2K, and capacitor 32 has a magnitude of about 22 microfarads. Converter 40 is a National Semiconductor LM331 voltage to frequency converter, resistor 42 has a magnitude of about 3.9K, resistor 46 has a magnitude of about 390K, resistor 48 has a maximum magnitude of 20K, resistor 52 has a magnitude of about 4.7K, capacitor 54 has a magnitude of about 2200 picofarads, resistor 73 has a magnitude of about 3.9K and diodes 28 and 44 are type 1N914. Resistor 70 has a magnitude of about 10K, resistors 82, 86 and 90 have magnitudes each of about 3.9K, and resistor 106 has a magnitude of about 499K.

It is therefore apparent that the present invention accomplishes its intended objects. Which an embodiment of the present invention has been described in detail, this is done for the purpose of illustration, not limitation.

I claim:

1. In a current to frequency converter comprising a current source, a voltage to frequency converter, an integrator in the feedback loop of said voltage to frequency converter, said current source being connected to a summing junction connected to said voltage to frequency converter and to said integrator such that the frequency of output pulses from said voltage to frequency converter is directly proportional to a magnitude of current injected from said source and inversely proportional to a magnitude of current injected from said voltage to frequency converter to the summing junction, the improvement comprising:
    controlled means for attenuating the current injected from said voltage to frequency converter to the summing junction to increase the frequency of output pulses.

2. Apparatus according to claim 1, wherein said controlled attenuating means comprises means for increasing the resistance in the path for current injected from said voltage to frequency converter to the summing junction in response to the presence of a control signal.

3. Apparatus according to claim 1, wherein said controlled attenuating means comprises resistance means and switching means responsive to a control signal for placing said resistance means in the current injection path.

4. Apparatus according to claim 1, wherein said current source comprises a photocell.

5. Apparatus according to claim 4, wherein said photocell is of the silicon type.

6. In a current to frequency converter comprising a current source, a voltage to frequency converter, an integrator in the feedback loop of said voltage to frequency converter, said current source being connected to a summing junction connected to said voltage to frequency converter and to said integrator such that the frequency of output pulses from said voltage to frequency converter is directly proportional to a magnitude of current injected from said source and inversely proportional to a magnitude of current injected from said voltage to frequency converter to the summing junction, the improvement comprising:
    controlled means for attenuating the current injected from said voltage to frequency converter to the summing junction to increase the frequency of output pulses, said controlled attenuating means comprising:
    (a) first normally closed switching means in the current injection path between said voltage to frequency converter and said summing junction;
    (b) a branch in parallel with said first switching means, said branch comprising the series combination of second normally closed switching means and first resistance means;
    (c) second resistance means connected in parallel with said path; and
    (d) signal responsive means connected in controlling relation to said first switching means;
    whereby the path for said injected current normally is entirely through said first switching means and when said first switching means is opened in response to a control signal the injected current is attenuated by an amount determined by a ratio of said first and second resistance means.

* * * * *